United States Patent
Maeda et al.

(10) Patent No.: US 6,945,167 B2
(45) Date of Patent: Sep. 20, 2005

(54) SCREEN PRINTING APPARATUS AND SCREEN PRINTING METHOD

(75) Inventors: Akira Maeda, Dazaifu (JP); Tetsuya Tanaka, Kurume (JP); Yuji Otake, Fukuoka (JP); Seiichi Miyahara, Kurume (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/849,613

(22) Filed: May 20, 2004

(65) Prior Publication Data

US 2004/0237813 A1 Dec. 2, 2004

(30) Foreign Application Priority Data

May 27, 2003 (JP) ..................................... P.2003-148739

(51) Int. Cl.⁷ ........................... B05C 17/04; B41M 1/12; B41L 3/02
(52) U.S. Cl. ..................... 101/123; 101/126; 101/129; 101/486
(58) Field of Search ................................. 101/123, 129, 101/126, 114, 115, 124, 127.1, 485, 486, 481

(56) References Cited

U.S. PATENT DOCUMENTS

| | | | | | |
|---|---|---|---|---|---|
| 4,610,200 | A | * | 9/1986 | Metso | 101/126 |
| 5,052,291 | A | * | 10/1991 | Takahashi et al. | 101/129 |
| 5,134,665 | A | * | 7/1992 | Jyoko | 382/150 |
| 5,176,078 | A | * | 1/1993 | Homma et al. | 101/126 |
| 5,459,941 | A | * | 10/1995 | Lowe | 33/620 |
| 5,479,854 | A | * | 1/1996 | Chikahisa et al. | 101/123 |
| 5,553,538 | A | * | 9/1996 | Freitag | 101/123 |
| 5,730,051 | A | * | 3/1998 | Takahashi et al. | 101/126 |
| 5,735,203 | A | * | 4/1998 | Taniguchi et al. | 101/126 |
| 5,740,729 | A | * | 4/1998 | Hikita et al. | 101/126 |
| 5,752,446 | A | * | 5/1998 | Squibb | 101/486 |
| 6,131,511 | A | * | 10/2000 | Wachi et al. | 101/129 |
| 6,609,458 | B2 | * | 8/2003 | Yamasaki et al. | 101/129 |
| 6,615,715 | B2 | * | 9/2003 | Abe et al. | 101/129 |
| 6,634,290 | B1 | * | 10/2003 | Shimizu et al. | 101/129 |
| 6,715,413 | B2 | * | 4/2004 | Yamasaki et al. | 101/123 |
| 6,715,415 | B2 | * | 4/2004 | Yamasaki et al. | 101/123 |
| 6,820,545 | B2 | * | 11/2004 | Yamasaki et al. | 101/123 |
| 2002/0007743 | A1 | | 1/2002 | Yamasaki et al. | 101/129 |
| 2002/0059875 | A1 | | 5/2002 | Yamasaki et al. | 101/129 |

FOREIGN PATENT DOCUMENTS

JP 10-146952 6/1998
JP 10-146953 6/1998

OTHER PUBLICATIONS

Patent Abstracts of Japan, Tokita Kunihiko, " Method for Screen Process Printing of Cream Solder", Publication No. 10146953, Publication Date Jun. 2, 1998, 1 page.

* cited by examiner

Primary Examiner—Daniel J. Colilla
Assistant Examiner—Wasseem H. Hamdan
(74) Attorney, Agent, or Firm—Pearne & Gordon LLP

(57) ABSTRACT

A screen printing apparatus and method in that in the print parameter setting process for setting print parameters including a squeegee movement speed, a printing pressure, and plate release conditions, a squeegee movement speed at which the squeegee is to be moved is set at the first step, then a printing pressure for realizing a desired cream solder charging state is set at the second step, and then plate release conditions for realizing a desired cream solder transfer state is set at the third step. Therefore, the print parameter setting process can be performed according to an efficient processing procedure and trial-and-error-based backward work can be avoided. Print parameters can be set quickly and properly for a wide range of solder types.

8 Claims, 13 Drawing Sheets

FIG. 7

| PATTERN NAME | A | B | C | |
|---|---|---|---|---|
| PARAMETER / SOLDER TYPE | S1 | S2 | S3 | |
| SQUEEGEE MOVEMENT SPEED | V1 | V2 | V3 | |
| PRINTING PRESSURE | P1 | P2 | P3 | |
| PLATE RELEASE PATTERN | I | II | III | |
| PLATE RELEASE SPEED | v1 | v2 | v3 | |

SCREEN PRINTING APPARATUS AND SCREEN PRINTING METHOD

BACKGROUND OF THE INVENTION

The present invention relates to a screen printing apparatus and a screen printing method for printing on a board using cream solder.

To secure good print quality in screen printing that prints on a board using cream solder, it is necessary to properly set, in accordance with a subject of printing, print parameters that determine various printing conditions. For example, it is necessary to set, in accordance with the characteristics of a print subject, various parameters such as the squeegee moving speed (i.e., the speed at which a squeegee is moved slidingly on a screen mask) and the printing pressure at which the squeegee is pressed against the screen mask.

A method that is commonly employed to make the print parameter setting as easy as possible is such that a print parameter library of standard sets of print parameters for plural kinds of solder are prepared in advance (refer to patent document 1, for example). With such a print parameter library, a standard set of parameters can be used for an existing solder type and hence the load of condition determining work for parameter setting that requires a high level of skill can greatly be reduced.

In many cases, it is possible to accommodate a new solder type by using existing print parameters with fine adjustments made to part of them and correcting the existing print parameters in accordance with print results, if a similar solder type is available. As the number of registered solder types increases, the contents of a print parameter library expand and the print parameter setting work is made more easier.

[Patent document 1] JP-A-10-146953

However, in recent years, because of the requirement from the environmental protection, new solder types such as lead-free ones have come to be used that are much different in composition from conventional lead-tin-based solder types that have been used commonly. Such new solder types are narrow in the range of applicability with electronic components and boards and hence are low in multiplicity of use: in an electronic components mounting line, it is necessary to selectively use many kinds of solder for various board and component types. There frequently occur cases that a conventional print parameter library cannot be used (even with modifications). A manufacturer may be obliged to do condition determining work on a trial-and-error basis to set print parameters, in which case print parameters may not be set quickly or properly.

SUMMARY OF THE INVENTION

In view of the above, an object of the present invention is to provide a screen printing apparatus and a screen printing method capable of setting print parameters quickly and properly for a wide range of solder types.

According to first aspect of the invention, it is provided a screen printing apparatus for printing on a board using cream solder through pattern holes of a mask plate by performing a squeegeeing operation in which the mask plate is laid on a board, comprising: a squeegee moved slidingly on a top surface of the mask plate while applying a constant printing pressure to the mask plate; a printing pressure applying means for applying printing pressure to the mask plate by pressing the squeegee against the mask plate; a squeegee moving means for moving the squeegee in a horizontal direction; a plate separation means for separating the board from a bottom surface of the mask plate; a printing control means for performing a printing operation at a prescribed squeegee movement speed and a prescribed printing pressure under prescribed plate release conditions by controlling the printing pressure applying means, the squeegee moving means, and the plate separation means; an inspecting means for inspecting a state of charging of the pattern holes with the cream solder and a state of transfer of the cream solder to the board by detecting states of the cream solder on the top surface of the mask plate and on a top surface of the board; a print parameter setting processing means for setting print parameters including the squeegee movement speed, the printing pressure, and a plate release speed to proper values on the basis of inspection results of the inspecting means that are obtained when the print parameters are varied according to prescribed parameter varying patterns that are set for the respective print parameters; and a print parameter storing means for storing the thus-set print parameters.

Preferably, the print parameter setting means sets the squeegee movement speed, the printing pressure, and the plate release conditions in this order.

According to second aspect of the invention, it is provided a screen printing apparatus for printing on a board using cream solder through pattern holes of a mask plate by performing a squeegeeing operation in which the mask plate is laid on a board, comprising: a squeegee moved slidingly on a top surface of the mask plate while applying a constant printing pressure to the mask plate, a printing pressure applying means for applying printing pressure to the mask plate by pressing the squeegee against the mask plate; a squeegee moving means for moving the squeegee in a horizontal direction; a plate separation means for separating the board from a bottom surface of the mask plate; a printing control means for performing a printing operation at a prescribed squeegee movement speed and a prescribed printing pressure under prescribed plate release conditions by controlling the printing pressure applying means, the squeegee moving means, and the plate separation means; a print parameter setting processing means for setting print parameters including the squeegee movement speed, the printing pressure, and a plate release speed to proper values on the basis of inspection results of a state of charging of the pattern holes with the cream solder and a state of transfer of the cream solder to the board that are obtained when the print parameters are varied; a print parameter storing means for storing the thus-set print parameters; and a processing procedure display means for displaying a processing procedure in print parameter setting processing of the print parameter setting processing means.

Preferably, the processing procedure display means displays processing procedure so that the squeegee movement speed, the printing pressure, and the plate release conditions are set in this order.

According to third aspect of the invention, a screen printing method for printing on a board using cream solder through pattern holes of a mask plate by performing a squeegeeing operation in which the mask plate is laid on a board and a squeegee is moved slidingly on the mask plate while the squeegee applies a constant printing pressure to the mask plate, wherein print parameter setting process for setting print parameters including a squeegee movement speed, a printing pressure, and plate release conditions that are specified when a printing operation is performed while a printing control means controls a printing pressure applying means for applying printing pressure to the mask plate by pressing the squeegee against the mask plate, a squeegee moving means for moving the squeegee in a horizontal direction, and a plate separation means for separating the board from a bottom surface of the mask plate includes a first step of setting a squeegee movement speed at which the squeegee is to be moved, a second step of setting a printing pressure at which the squeegee is to be pressed against the mask plate, and a third step of setting a plate release speed at which the board is to be separated from the bottom surface of the mask plate; in the second step a printing pressure for realizing a desired cream solder charging state is set by performing squeegeeing operations at the squeegee movement speed that was set at the first step while varying the printing pressure according to a prescribed varying pattern and inspecting a state of charging of the pattern holes with the cream solder at each printing pressure by detecting a state of the cream solder on the mask plate; and in the third step plate release conditions for realizing a desired cream solder transfer state are set by performing a squeegeeing operation at the squeegee movement speed that was set at the first step and at the printing pressure that was set at the second step, and then performing plate separation operations of separating the board from the bottom surface of the mask plate while varying the plate release conditions according to prescribed varying patterns and inspecting a cream solder transfer state on the board under each set of plate release conditions.

Preferably, a fourth step of setting a squeegee movement speed that is higher than the squeegee movement speed that was set at the first step and a fifth step of setting a printing pressure at the squeegee movement speed that was set at the fourth step are executed after the third step; and in the fifth step a printing pressure for realizing a desired cream solder charging state is set by performing squeegeeing operations while varying the printing pressure according to a prescribed varying pattern and inspecting a state of charging of the pattern holes with the cream solder at each printing pressure by detecting a state of the cream solder on the mask plate.

According to the invention, in the print parameter setting processing for setting print parameters including a squeegee movement speed, a printing pressure, and plate release conditions, a squeegee movement speed at which the squeegee is to be moved is set at the first step, then a printing pressure for realizing a desired cream solder charging state is set at the second step, and then plate release conditions for realizing a desired cream solder transfer state is set at the third step. Therefore, the print parameter setting processing can be performed according to an efficient processing procedure and trial-and-error-based backward work can be avoided. Print parameters can be set quickly and properly for a wide range of solder types.

BRIEF DESCRIPTION OF THE DRAWINGS

FIG. 7 illustrates data of a print parameter library of the screen printing apparatus according to the embodiment of the invention.

DETAILED DESCRIPTION OF THE PREFERRED EMBODIMENTS

Next, an embodiment of the present invention will be described with reference to the drawings.

First, the structure of a screen printing apparatus will be described with reference to FIGS. 1–3. This screen printing apparatus has not only a printing mechanism for printing, using cream solder, on aboard to be mounted with electronic components but also, as described later, a print inspecting function of inspecting a cream solder print state on a board after execution of screen printing and a processing function of setting print parameters on the basis of results of the print inspection.

Figure 1:
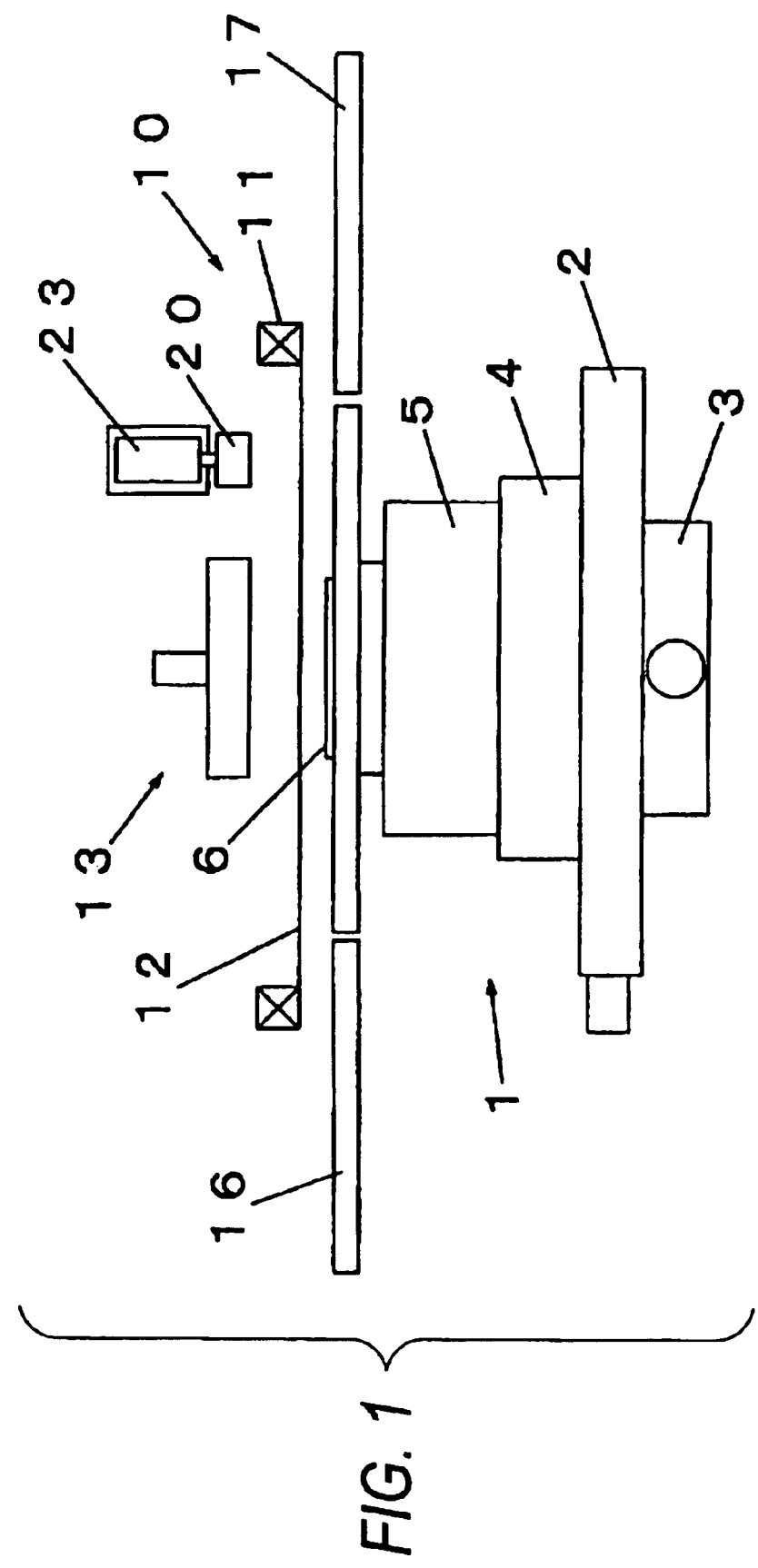
FIG. 1 is a front view of a screen printing apparatus according to an embodiment of the present invention.
Figure 2:
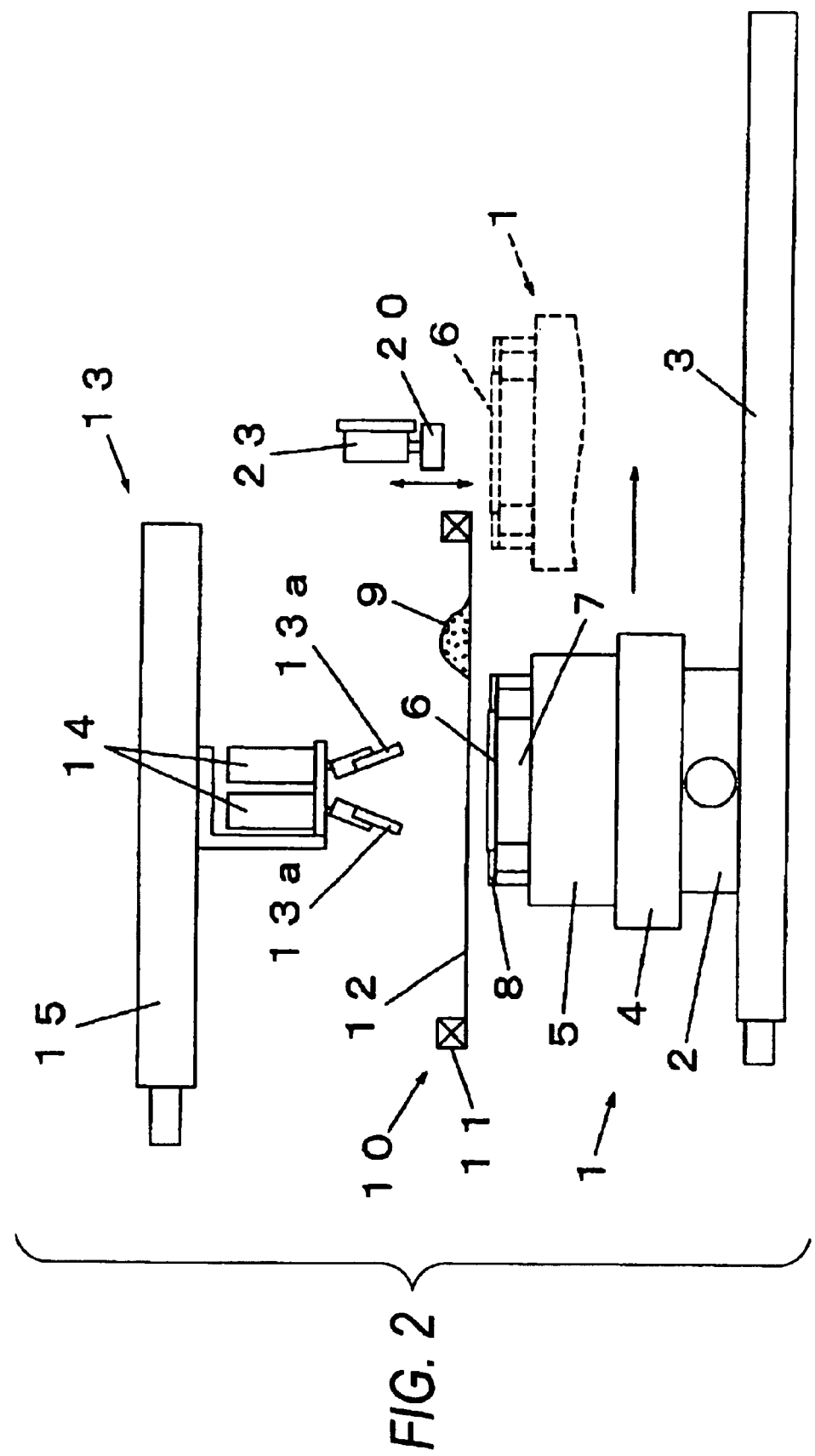
FIG. 2 is a side view of the screen printing apparatus according to the embodiment of the invention.
Figure 3:
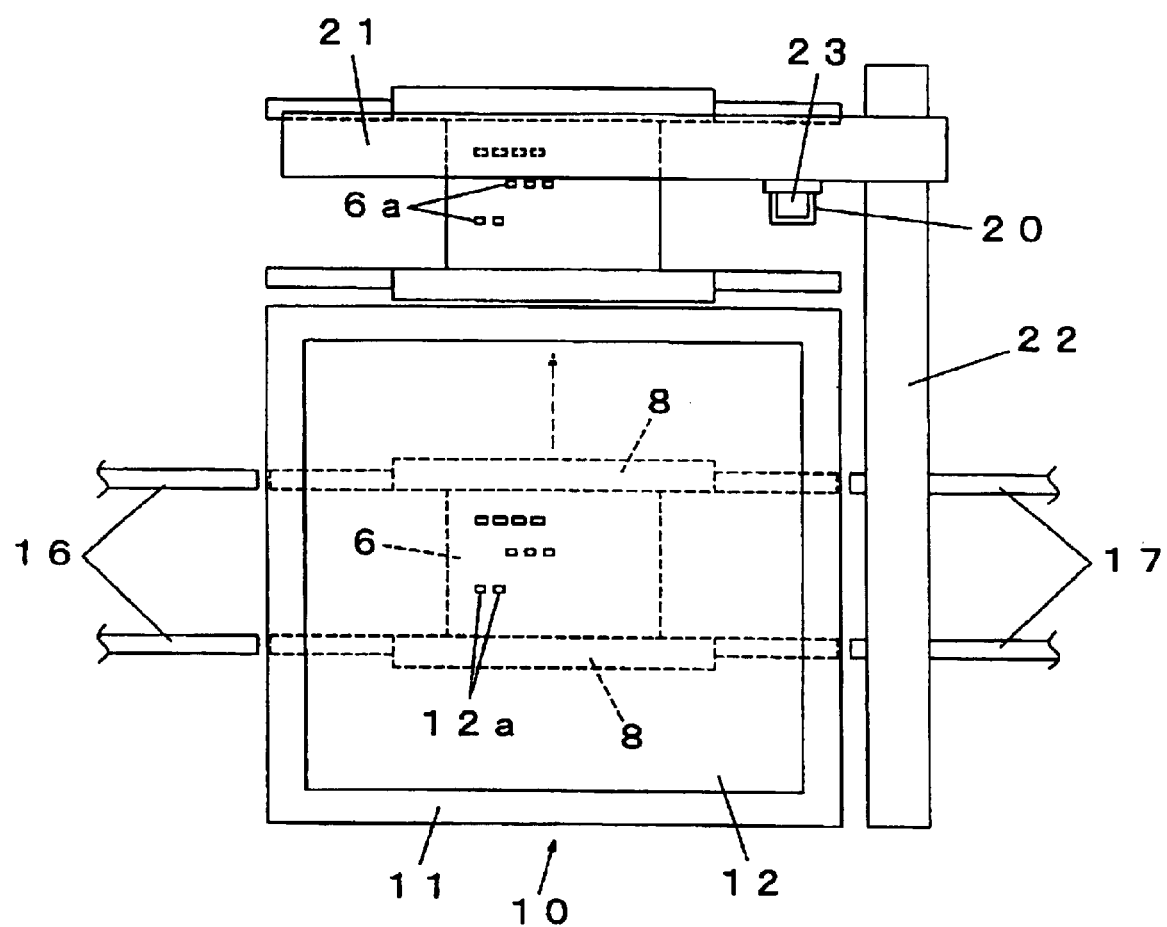
FIG. 3 is a plan view of the screen printing apparatus according to the embodiment of the invention.

As shown in FIGS. 1 and 2, a board positioning unit 1 is configured as follows. A θ-axis table 4 is placed on a movable table that is composed of an X-axis table 2 and a Y-axis table 3. A Z-axis table 5 is placed on the θ-axis table 4. A board holding unit 7 for holding, from below, a board 6 that is clamped by a clamper 8 is provided on the Z-axis table 5. The board 6 as a subject of printing is brought to the position of the board positioning unit 1 by a bring-in conveyor 16 (see FIGS. 1 and 3). The board 6 is moved in the X and Y directions by driving the board positioning unit 1 and is thereby positioned at a printing position and a board recognition position (described later). After being subjected to printing, the board 6 is carried out by a carry-out conveyor 17.

A screen mask 10 in which a mask plate 12 is attached to a holder 11, is disposed over the board positioning unit 1. The board 6 is positioned with respect to the mask plate 12 in the X and Y directions by the X-axis table 2, the Y-axis table 3, and the θ-axis table 4 of the board positioning unit 1, and is brought into contact with or separated from the bottom surface of the mask plate 12 by the Z-axis table 5. The Z-axis table 5 serves as a plate separation means for separating the board 5 from the bottom surface of the mask plate 12.

A squeegee unit 13 is disposed over the screen mask 10. The squeegee unit 13 is composed of pressing mechanisms 14 for pressing squeegees 13a against the mask plate 12 and a movable table 15 for moving the squeegees 13a on the top surface of the mask plate 12. The squeegees 13a are pressed against the mask plate 12 by driving the pressing mechanisms 14 and are moved on the mask plate 12 by driving the movable table 15. The pressing mechanisms 14 serve as a printing pressure applying means for applying printing pressure to the mask plate 12 by pressing the squeegees 13a against the mask plate 12, and the movable table 15 serves as a squeegee moving means for moving the squeegees 13a in a horizontal direction.

Cream solder 9 is supplied to the mask plate 12 in a state that the mask plate 12 is laid on the board 6, and a squeegeeing operation is performed in which the squeegees 13a are slid on the top surface of the mask plate 12 while applying constant printing pressure to the mask plate 12. As a result, cream solder 9 is transferred to and printed on the printing surface of the board 6 through pattern holes 12a of the mask plate 12.

A laser measuring instrument 20 is disposed above the screen mask 20. As shown in FIG. 3, the laser measuring instrument 20 is moved horizontally, that is, in the X and Y directions, by an X-axis table 21 and a Y-axis table 22 and can be elevated and lowered freely by an elevating means 23 (see FIGS. 1 and 2). The laser measuring instrument 20 is lowered to a measurement height position by driving the elevating means 23. The X-axis table 21, the Y-axis table 22, and the elevating means 23 serve as a moving means for moving the laser measuring instrument 20.

Figure 4:
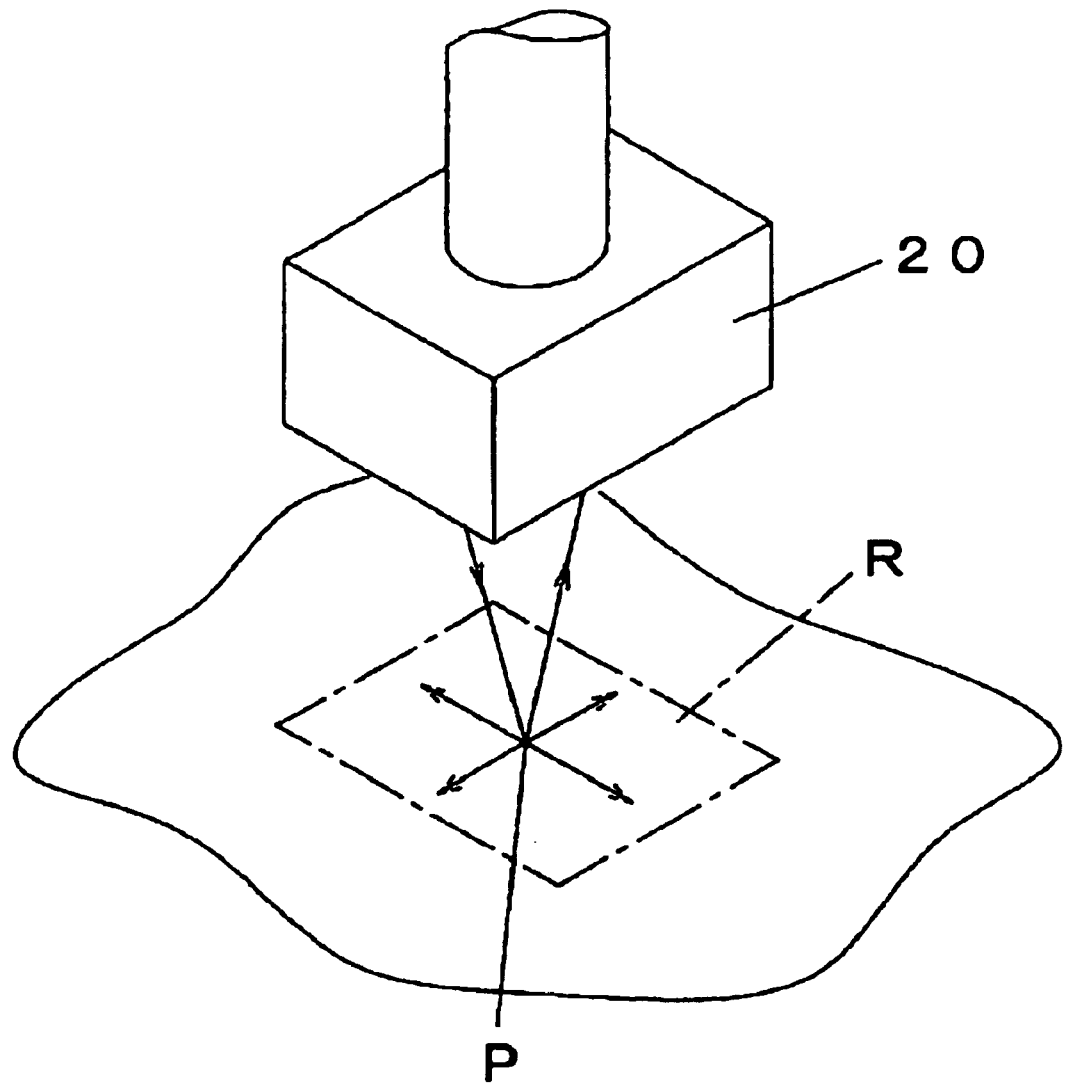
FIG. 4 is a perspective view of a laser measuring instrument of the screen printing apparatus according to the embodiment of the invention.

The laser measuring instrument 20 has a function of measuring a vertical displacement through illumination with laser light and a scanning function of scanning the laser illumination position in the X and Y directions. As shown in FIG. 4, vertical positions of the surface of a measurement object in a measurement range R are detected successively by scanning the illumination point P in the measurement range R, whereby a three-dimensional shape of the measurement object can be detected.

A three-dimensional shape of the board 6 or the mask plate 12 in an arbitrary range can be measured from above by moving the laser measuring instrument 20 with respect to the board 6 or the mask plate 12 by the moving means. More specifically, the top surface of the mask plate 12 is measured three-dimensionally after squeegeeing was performed by moving the squeegee unit 13 in a state that the board 6 was in contact with the bottom surface of the mask plate 12. As a result, a state of charging of the pattern holes 12a with the cream solder 9 is detected. More specifically, undercharging in which the pattern holes 12a are not filled with cream solder 9 completely, overcharging in which cream solder 9 remains on the surface of the mask plate 12 other than the pattern holes 12a because of a squeegeeing failure, or a like charging state is detected.

Also, the board 6 is moved away from the mask plate 12 after a squeegeeing operation. Then, the board 6 is moved into a measurable range of the laser measuring instrument 20 (see the board 6 drawn by broken lines in FIG. 2) and the top surface of the board 6 is measured three-dimensionally. As a result, a state of transfer of the cream solder 9 to the board 6 is detected; that is, an insufficient-transfer-amount state in which a regular transfer amount is not obtained, an improper shape of transferred cream solder 9, or a like transfer state is detected.

Figure 5:
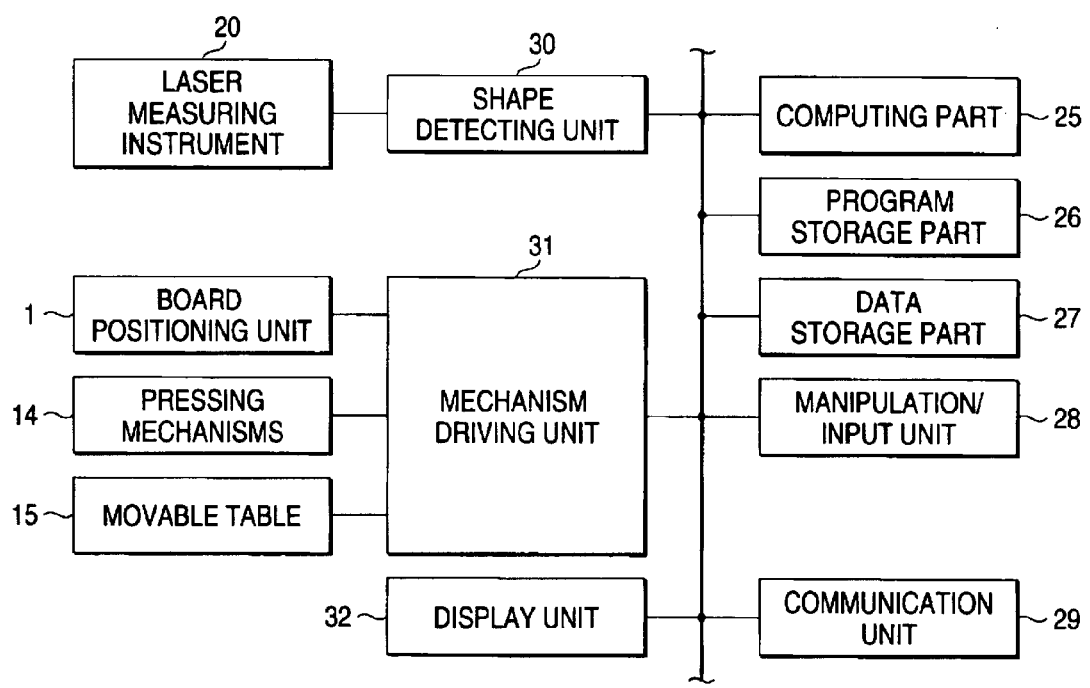
FIG. 5 is a block diagram showing the configuration of a control system of the screen printing apparatus according to the embodiment of the invention.

Next, the configuration of a control system of the screen printing apparatus will be described with reference to FIG. 5. In FIG. 5, a computing part 25, which is a CPU, performs various calculations and processing (described later) by executing various programs stored in a program storage part 26. Various data stored in a data storage part 27 are used in those calculations and processing.

A manipulation/input unit 28, which is an input means such as a keyboard and a mouse, inputs various control commands and data. A communication unit 29 exchanges data with other apparatus that constitute an electronic component mounting line together with the screen printing apparatus. A shape detecting unit 30 detects a shape of a measurement object by processing measurement results of the laser measuring instrument 20 that are obtained in the above-described manner.

A mechanism driving unit 31 drives the board positioning unit 1 for positioning the board 6 with respect to the mask plate 12, the pressing mechanisms 14 for pressing the squeegees 13a against the mask plate 12, the movable table 15 for moving the squeegees 13a on the mask plate 12, and the moving means for moving the laser measuring instrument 20. A display unit 32, which is a display device, is a display means for displaying a guide screen of print parameter setting processing (described later), a judgment result of a print inspection, etc.

Figure 6:
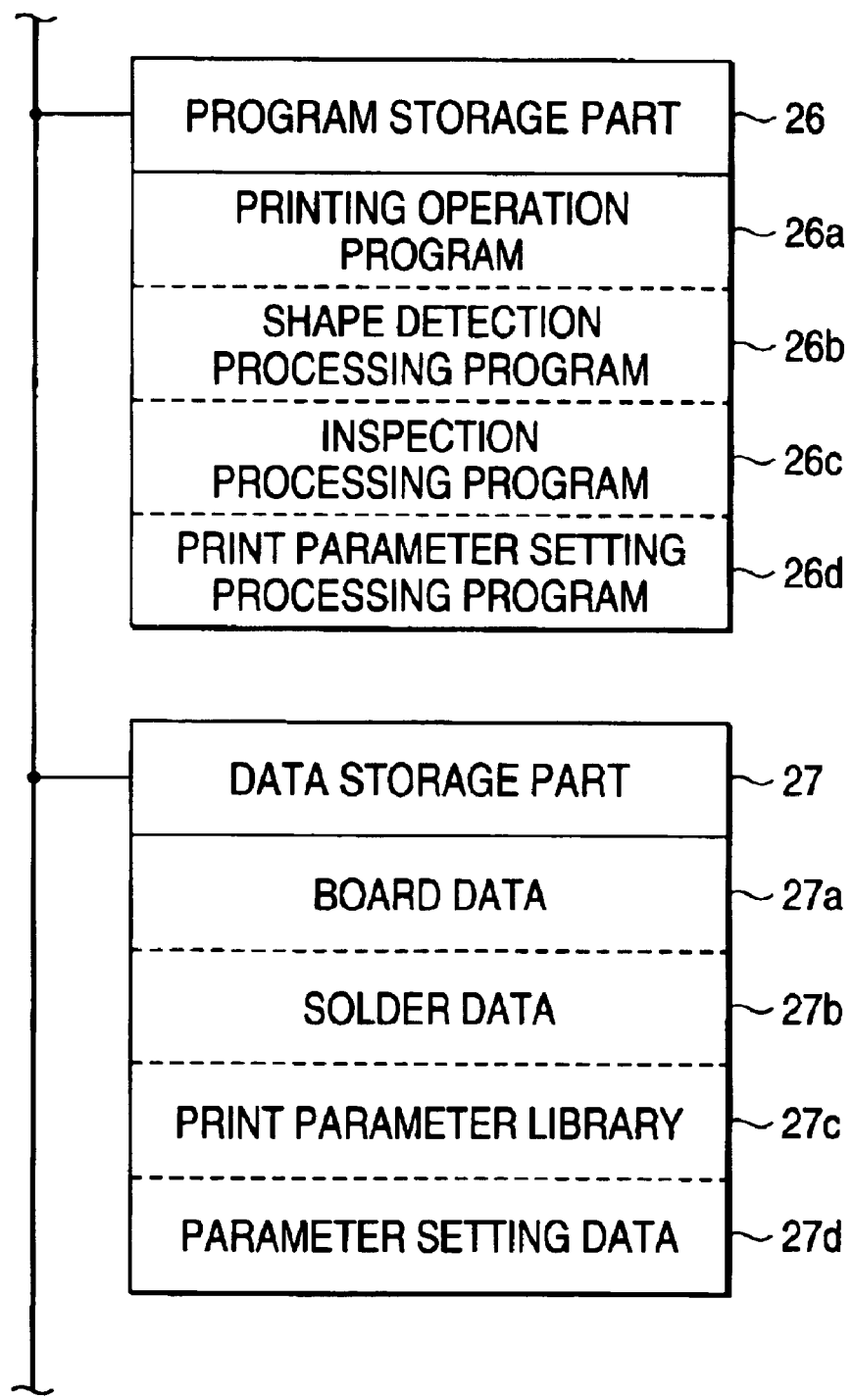
FIG. 6 illustrates programs and data that are stored in the screen printing apparatus according to the embodiment of the invention.

Next, programs and data that are stored in the program storage part 26 and the data storage part 27, respectively, will be described with reference to FIG. 6. Various programs such as a printing operation program 26a, a shape detection processing program 26b, an inspection processing program 26c, and a print parameter setting processing program 26d are stored in the program storage part 26. The details of these programs will be described later.

Board data 27a, solder data 27b, a print parameter library 27c, and parameter setting data 27d are stored in the data storage part 27. The board data 27a are data indicating types of boards as subjects of printing of the printing apparatus concerned. The solder data 27b are data indicating types of cream solder used for screen printing.

The print parameter library 27c is a collection of data that indicate various parameters in a screen printing operation and the data are stored in the form of a data library. As shown in FIG. 7, the print parameter library 27c is edited as combinations of parameter items such as a squeegee movement speed (i.e., a speed at which the squeegees 13a are moved), a printing pressure at which the squeegees 13a are pressed against the screen mask 10, and plate release conditions (i.e., conditions of separation of the board 6 from the bottom surface of the mask plate 12; a combination of a plate release speed and a plate release pattern indicating an operation pattern at the time of separation). Each of those combinations is stored in such a manner as to be correlated with a corresponding solder type and given a pattern name.

The parameter setting data 27d are data that are referred to in print parameter setting process (described later). In the print parameter setting process, squeegeeing operations are performed actually under various printing conditions that are obtained by varying the above-mentioned parameter items and charging states of the cream solder 9 are inspected. Further, plate separation operations are performed and states of transfer of the cream solder 9 to boards 6 are inspected. A combination of parameters that gives the best printing conditions is determined on the basis of inspection results. The parameter setting data 27d include parameter varying patterns indicating pitches of variation of the respective parameters and threshold values that are used for automatically judging whether a charging state or a transfer state of the cream solder 9 is proper.

Figure 8:
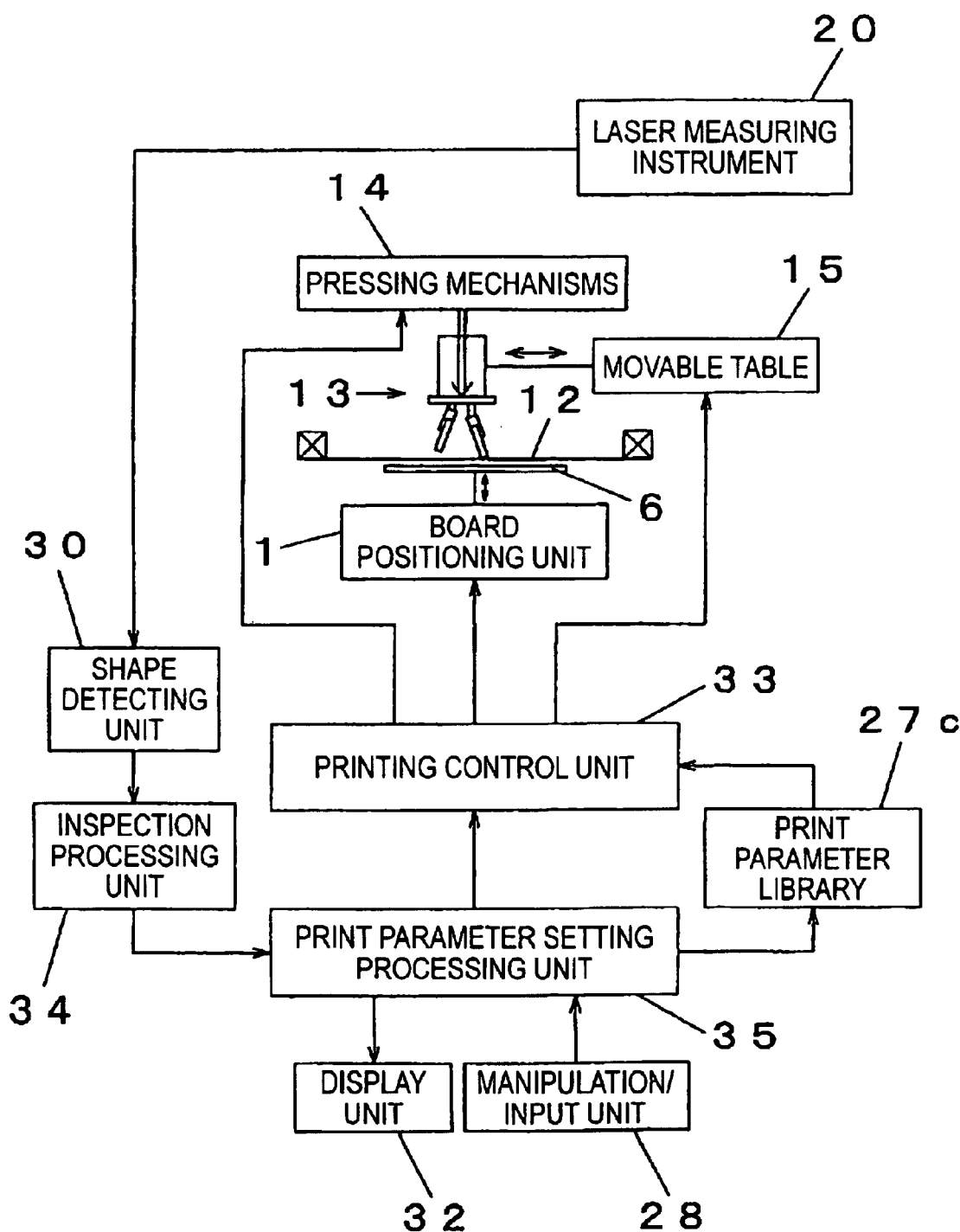
FIG. 8 is a functional block diagram of a print parameter setting processing function of the screen printing apparatus according to the embodiment of the invention.

Next, the print parameter setting processing function will be described with reference to FIG. 8. In FIG. 8, a printing control unit 33, a shape detecting unit 30, an inspection processing unit 34, and a print parameter setting processing unit 35 are processing functions that are realized by the computing unit 25's executing the printing operation program 26a, the shape detection processing program 26b, the inspection processing program 26c, and the print parameter setting processing program 26d, respectively.

The printing control unit 33 (printing control means) controls the operations of the pressing mechanisms 14 (printing pressure applying means) and the movable table 15 (squeegee moving means) and causes printing on the board 6 using the cream solder 9 at a prescribed printing pressure, squeegee movement speed, and plate release speed.

The shape detecting unit 30 processes measurement results of the laser measuring instrument 20 and thereby detects a state of charging of the pattern holes 12a of the mask plate 12 with the cream solder 9 and a state of transfer of the cream solder 9 to the top surface of the board 6. The inspection processing unit 34 checks whether the charging state and the transfer state of the cream solder 9 that have been detected by the shape detecting unit 30 are proper. The inspection threshold data that are included in the parameter setting data 27d are used in this inspection processing.

The laser measuring instrument 20, the shape detecting unit 30, and the inspection processing unit 34 are inspecting means for inspecting a state of charging of the pattern holes 12a with the cream solder 9 and a state of transfer of the cream solder 9 to the board 6 by detecting states of the cream solder 9 on the top surface of the mask plate 12 and the top surface of the board 6. Although in this embodiment the testing means employs the configuration that enables three-dimensional measurement, a charging state and a transfer state of the cream solder 9 may be inspected by using, instead of the laser measuring instrument 20, a camera for acquisition of an optical image and performing processing of recognizing an acquired image.

The print parameter setting processing unit 35 (print parameter setting processing means) performs processing of setting print parameters (described above). More specifically, the print parameter setting processing unit 35 performs actual screen printing on subject boards 6 using subject cream solder 9 and sets the print parameters including the printing pressure, the squeegee movement speed, and the plate release speed to proper values on the basis of inspection results of the inspecting means that are obtained when the print parameters are varied according to the prescribed parameter varying patterns that are determined for the respective parameters. The thus-set print parameters are written to the data storage part 27 as part of the print parameter library 27c. The data storage part 27 serves as a print parameter storing means for storing set print parameters.

Next, the print parameter setting process will be described with reference to a flowchart of FIG. 9 and display screens of FIGS. 10 and 11. This process is executed to set proper printing conditions when a new solder type that is not registered in the print parameter library 27c is used for printing. This process is executed according to a procedure of guide screens 40 that are displayed on the display unit 32.

Upon a start of the process, a processing mode is selected. That is, an automatic mode or a semiautomatic mode is selected by manipulating one of two selection buttons 41a and 41b shown in FIG. 10(a). In the automatic mode, a process of setting proper print parameters is performed automatically on the basis of the data stored in the data storage part 27. In the semiautomatic mode, parameter setting is performed in such a manner that an operator inputs parameter values according to a processing procedure of displayed guide screens. The following description will be directed to an example in which the selection button 41a is manipulated and an automatic-mode process is executed.

Figure 9:
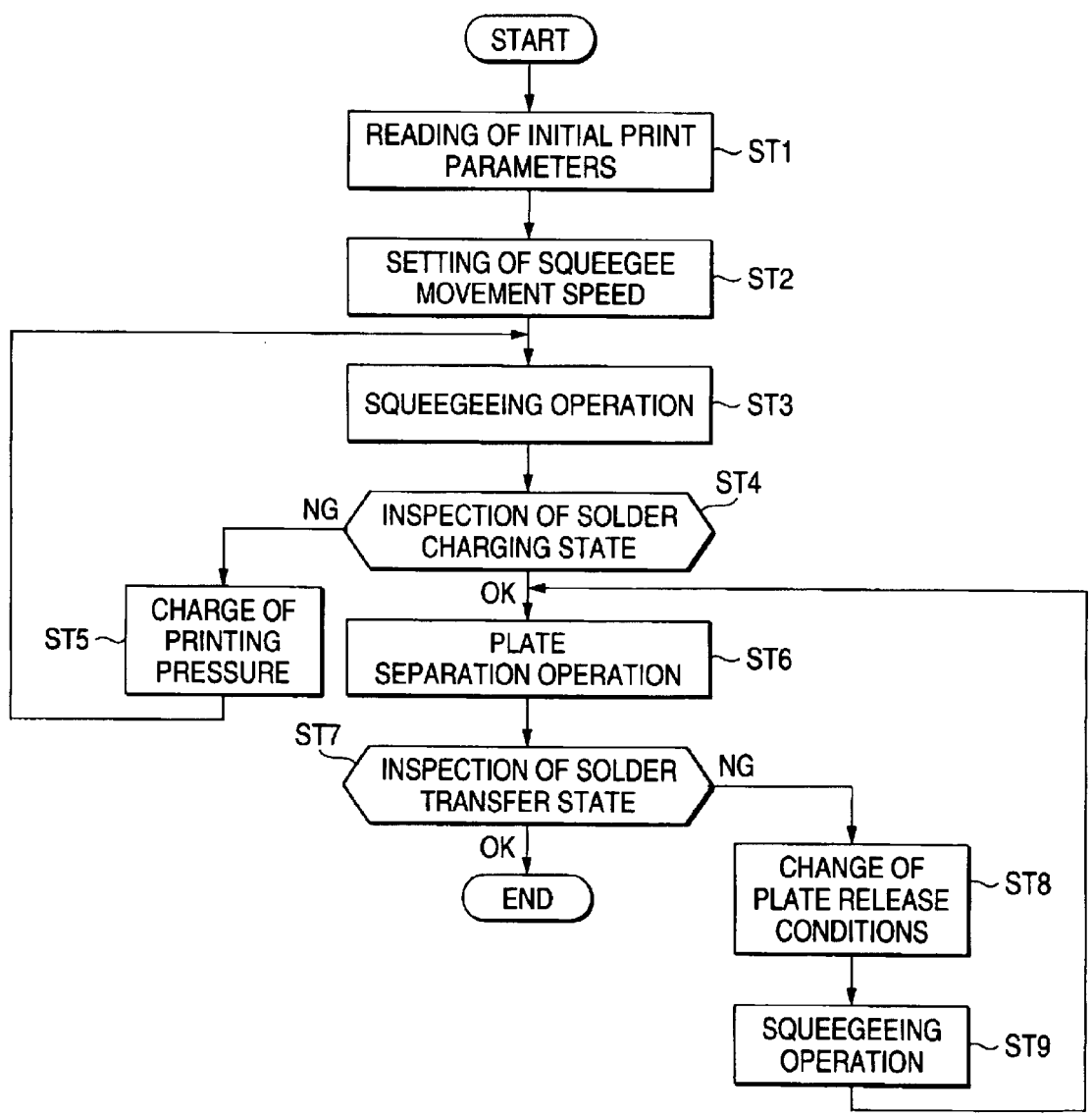
FIG. 9 is a flow chart of a print parameter setting process of a screen printing method according to the embodiment of the invention.
Figure 10:
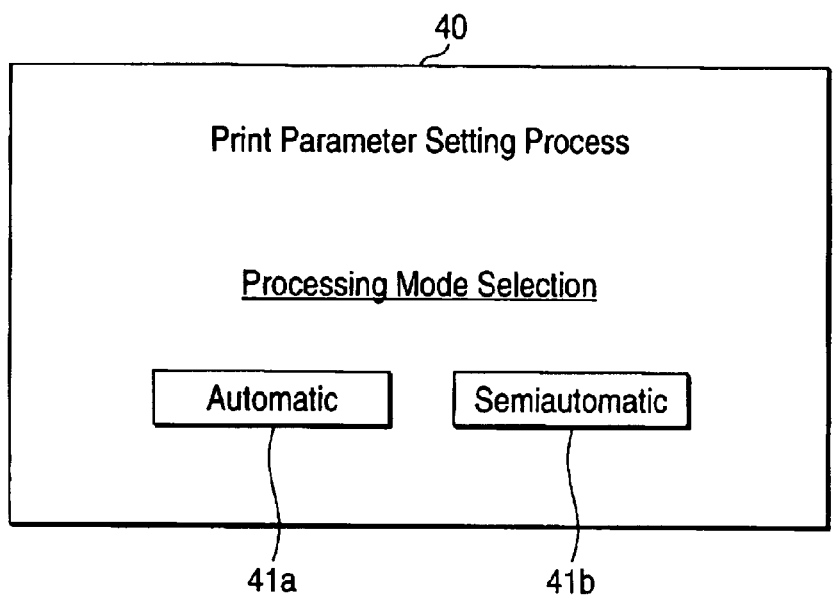
FIGS. 10(a) and 10(b) show displayed pictures of the screen printing apparatus according to the embodiment of the invention.
Figure 10:
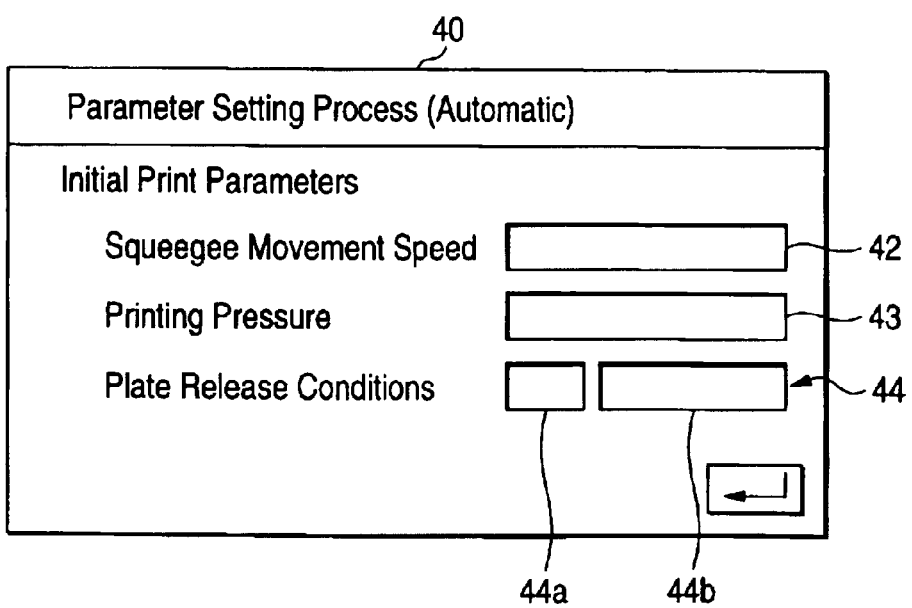

First, referring to FIG. 9, initial print parameters are read (step ST1). That is, preset initial values are read from the data storage part 27. Then, as shown in FIG. 10(b), the thus-read initial print parameters, that is, a squeegee movement speed, a printing pressure, and plate release conditions are displayed in display frames 42, 43, and 44 of a display screen 40. As for the plate release conditions, a plate release pattern and a plate release speed are displayed as a combination in respective display frames 44a and 44b.

Next, a squeegee movement speed is set. To maintain the squeegee movement speed of the displayed initial print parameters, a decision manipulation is performed by using an enter key. On the other hand, to set a parameter value that is different from the initial value, the intended parameter value is input to the display frame 42 and a decision manipulation is performed. The squeegee movement speed for an actual printing operation is set in this manner (first step; step ST2).

Then, a printing pressure at which the squeegees 13a are to be pressed against the mask plate 12 is set (second step) In this embodiment, an optimum printing pressure is determined on the basis of inspection results, that is, solder charging states, that are obtained when actual squeegee operations are performed while the printing pressure is varied at the squeegee movement speed that was set at the above step. First, a squeegeeing operation is performed at the initial printing pressure value (step ST3). Then, a shape of the mask plate 12 is detected by the laser measuring instrument 20 and a solder charging state is inspected in a state that the board 6 is brought in contact with the bottom surface of the mask plate 12 (step ST4). If inspection results are proper, the initial value itself is set as a printing pressure decided value.

If the inspection results are improper, the printing pressure is changed by the variation pitch of the prescribed varying pattern indicated by the parameter setting data 27d (step ST5). Then, the process returns to step ST3. Similar steps are there after executed repeatedly until good inspection results are obtained at step ST4. A printing pressure decided value obtained by those steps is set as a parameter for an actual printing operation.

That is, in the above steps, a printing pressure for realizing a desired cream solder charging state is set by performing squeegeeing operations while varying the printing pressure according to the prescribed varying pattern starting from a squeegee movement speed that was set at step ST2 and detecting a state of the cream solder 9 on the mask plate 12, that is, inspecting a state of charging of the pattern holes 12a with the cream solder 9, at each printing pressure value.

Subsequently, plate releasing conditions at the time of separation of the board 6 from the bottom surface of the mask plate 12 are set (third step). In this embodiment, optimum plate release conditions are determined on the basis of solder transfer state inspection results that are obtained when actual plate separation operations are performed at the squeegee movement speed and the printing pressure that were set at the above steps while the plate release conditions are varied. First, a plate separation operation is performed by using the initial values of the plate release conditions (step ST6). Then, shapes of cream solder 9 on the top surface of the board 6 are detected by the laser measuring instrument 20 and a solder transfer state is inspected (step ST7). If inspection results are proper, the initial values themselves are set as fixed plate release conditions.

If the inspection results are improper, the plate release conditions are changed to a combination of a plate release pattern and a plate release speed according to the prescribed varying pattern indicated by the parameter setting data 27*d* (step ST8) and a squeegeeing operation is performed under the new conditions (step ST9). Then, the process returns to step ST6. Similar steps are executed until good inspection results are obtained at step ST7. Decided plate release conditions obtained by those steps are set as parameters for an actual printing operation.

In other words, in the above steps, plate release conditions for realizing a desired cream solder transfer state are set by performing a squeegeeing operation at the squeegee movement speed that was set at the first step and the printing pressure that was set at the second step, performing operations of separating boards 6 from the bottom surface of the mask plate 12 while varying the plate release conditions, and inspecting cream solder transfer states on the boards 6 corresponding to the respective sets of plate release conditions.

Figure 11:
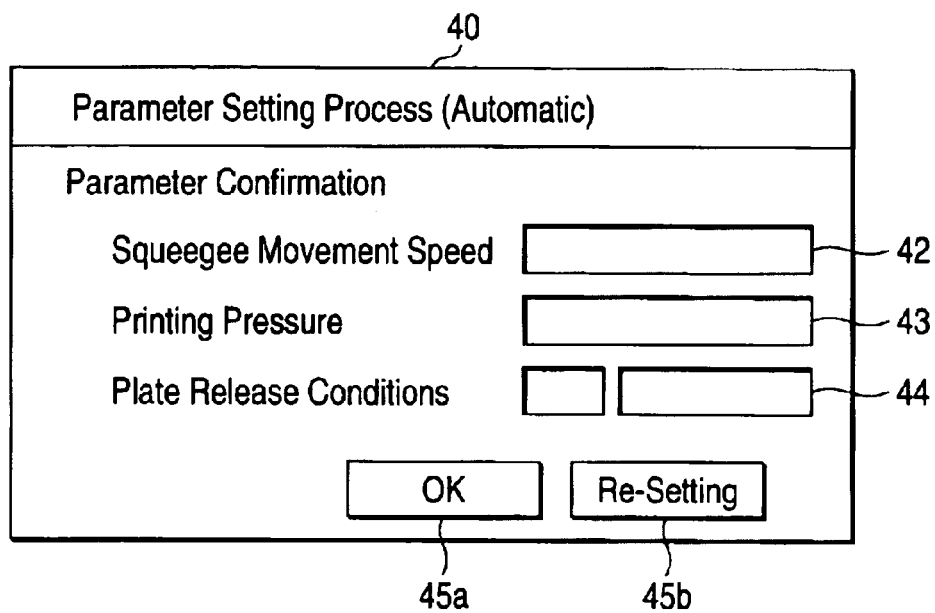
FIGS. 11(a) and 11(b) show other displayed pictures of the screen printing apparatus according to the embodiment of the invention.
Figure 11:
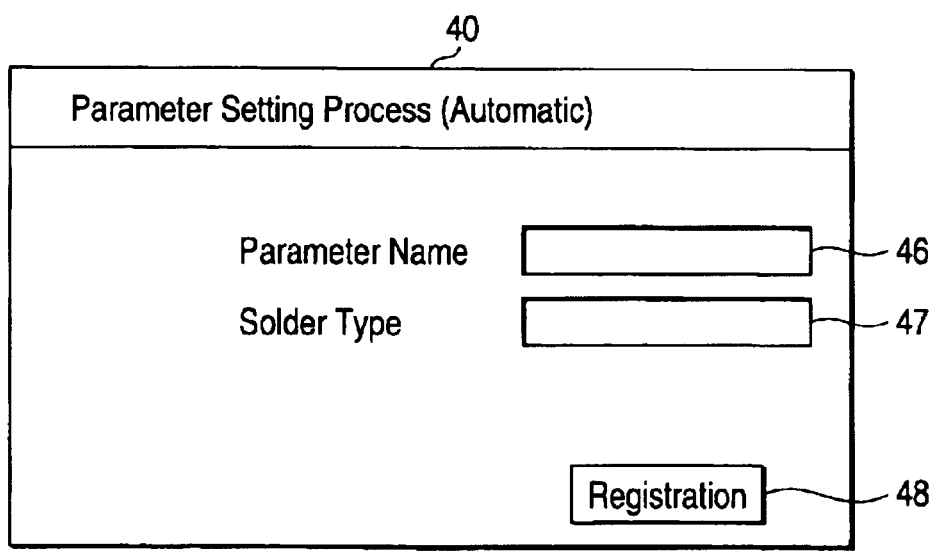

Print parameters including the thus-set squeegee movement speed, printing pressure, and plate release conditions are displayed in a confirmation screen shown in FIG. 11(*a*). If the automatically set parameter values have no problems, the operator manipulates an OK button 45*a*, whereupon a registration process (described below) is executed. If there is any problem, the operator manipulates a re-setting button 45*b*, whereupon an automatic-mode setting process is executed again after a change of the squeegee movement speed or semiautomatic-mode setting (described later) is performed.

If the print parameters are confirmed (OK), the operator inputs a type of solder used and a parameter name to respective input frames 46 and 47 shown in FIG. 11(*b*) and manipulates a registration button 48. As a result, the newly set print parameters are registered in the print parameter library 27*d* (see FIG. 7) after being correlated with the solder type and given the pattern name. As described above, in the print parameter setting process, a squeegee movement speed is set first and then a printing pressure and a plate release speed are set in this order. This minimizes the frequency of occurrence of going backward in executing a series of steps and realizes efficient print parameter setting.

Figure 12:
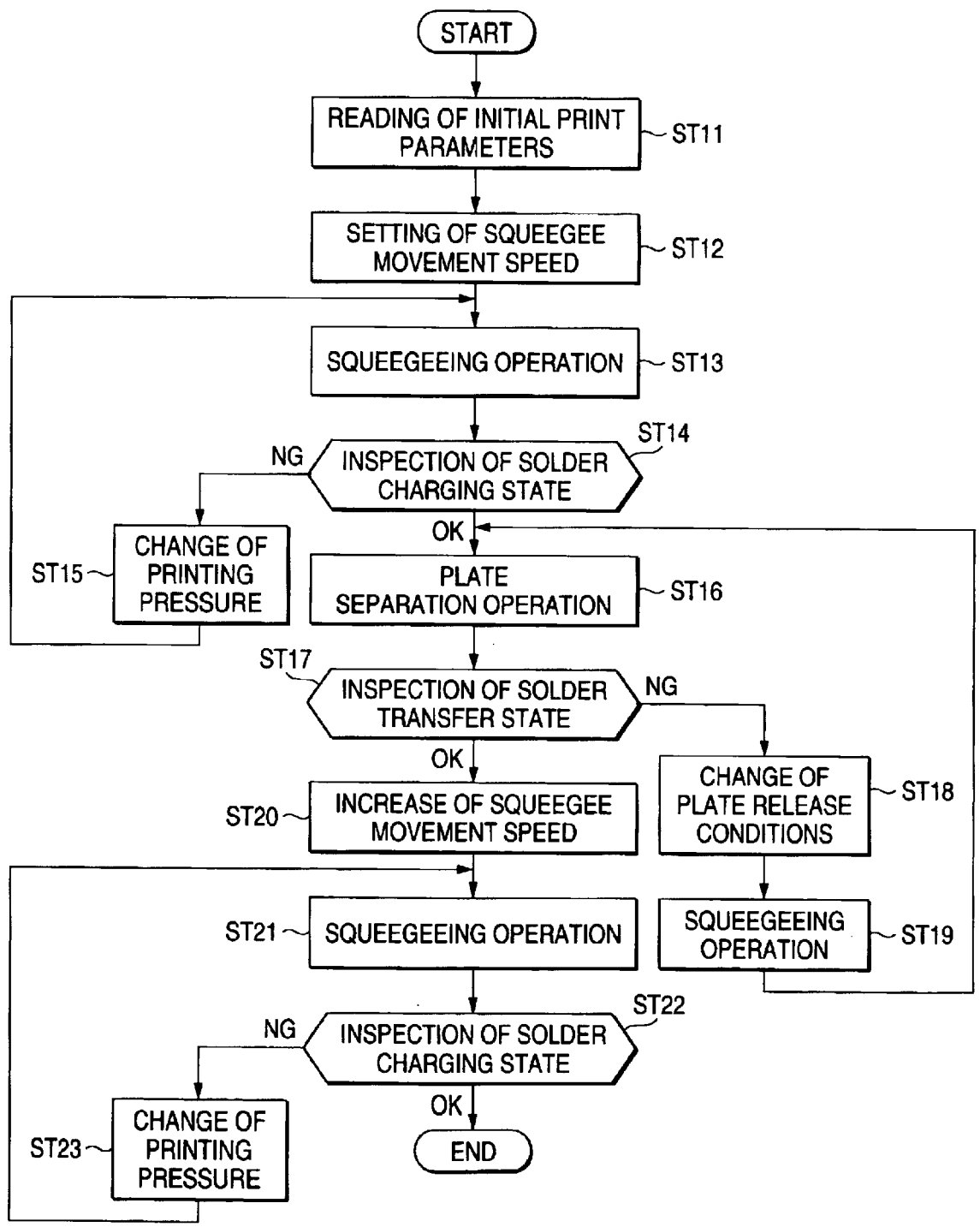
FIG. 12 is a flowchart of a print parameter setting process of a screen printing method according to a modification of the embodiment of the invention.

After print parameters are set by the above print parameter setting process, the squeegee movement speed may be changed in the increasing direction to shorten the print cycle time. As shown in FIG. 12, after execution of steps ST11–ST17 that are the same as steps ST1–ST7 of FIG. 9, the squeegee movement speed is increased (step ST20). Then, steps ST21–ST23 are executed that are the same as steps ST3–ST5 of FIG. 9. This squeegee movement speed adjustment enables efficient screen printing work while securing high print quality.

That is, in this squeegee movement speed adjustment process, after setting of plate release conditions (third step; see FIG. 9), a fourth step sets a squeegee movement speed that is higher than a squeegee movement speed that was set at the first step and a fifth step sets a printing pressure according to the squeegee movement speed that has been set at the fourth step. At the fifth step, a printing pressure for realizing a desired cream solder charging state is set by performing squeegeeing operations while varying the printing pressure according to the prescribed varying pattern and detecting a state of the cream solder 9 on the mask plate 12, that is, inspecting a state of charging of the pattern holes 12*a* with the cream solder 9, at each printing pressure value.

Figure 13:
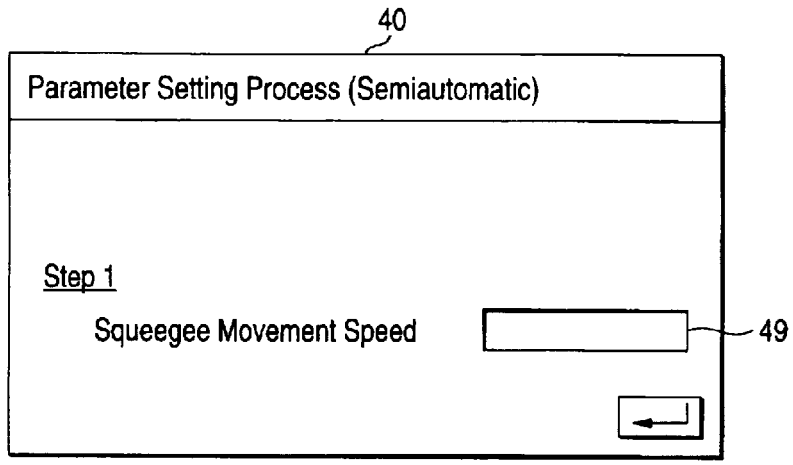
FIGS. 13(a) to 13(c) show displayed pictures of the screen printing apparatus according to the embodiment of the invention.
Figure 13:
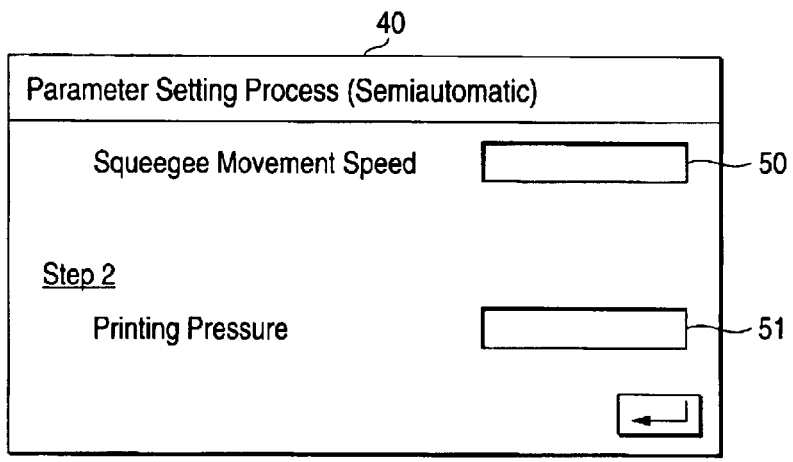
Figure 13:
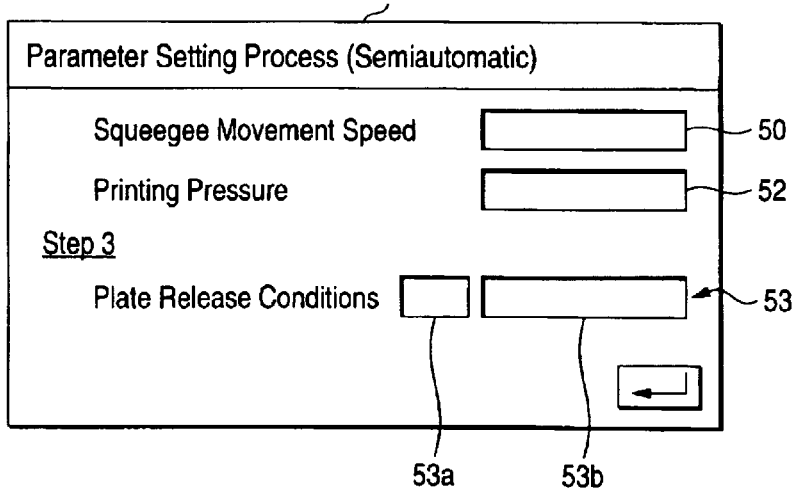

Next, the semiautomatic-mode print parameter setting process that is executed with an operator's manipulations will be described with reference to FIG. 13. This process is started by manipulation of the selection button 41*b* in the display screen of FIG. 10(*a*), and is executed while necessary instruction data are input to the print parameter setting processing unit 35 (see FIG. 8) through the manipulation/input unit 28. Upon a start of the semiautomatic-mode process, guide screens shown in FIG. 13 are displayed in order on the display unit 32 according to a processing procedure. That is, the display unit 32 is a processing procedure display means for displaying a processing procedure in a print parameter setting process that is executed by the print parameter setting processing unit 35.

First, as shown in FIG. 13(*a*), an input frame 49 to which to input a squeegee movement speed is displayed as step 1. The operator inputs a squeegee movement speed that is suitable for a given target cycle time and then manipulates the enter key. In response, the input parameter value is set as a squeegee movement speed for an actual printing operation (first step) and a guide screen of step 2 is displayed as shown in FIG. 13(*b*)

In this guide screen, the squeegee movement speed that was input and set by the above-mentioned manipulation is displayed in a display frame 50. The operator inputs, to an input frame 51, a printing pressure that is considered appropriate for this squeegee movement speed, and then manipulates the enter key. In response, steps ST3–ST5 shown in FIG. 9 are executed automatically, whereby a printing pressure that produces a good solder charging result at the set squeegee movement speed is set (second step).

Then, a guide screen of step 3 is displayed as shown in FIG. 13(*c*). In this guide screen, the squeegee movement speed that was input and set by the above-mentioned manipulation and the printing pressure that has been set in the above-described manner are displayed in respective display frames 50 and 52. The operator inputs, to an input frame 53, plate release conditions that are considered appropriate for the squeegee movement speed and the printing pressure.

In this embodiment, the operator inputs a plate release pattern and a plate release speed as a combination to respective input frames 53*a* and 53*b* and then manipulates the enter key. In response, steps ST6–ST9 shown in FIG. 9 are executed automatically, whereby plate release conditions that provide a good solder transfer result at the set squeegee movement speed and printing pressure are set (third step).

Print parameters including the thus-set squeegee movement speed, printing screen, and plate release conditions are displayed in a confirmation screen (see FIG. 11(*a*)). If the print parameters are confirmed (OK), the newly set print parameters are registered in the print parameter library 27*d* (see FIG. 7) after being correlated with a solder type and given a pattern name in the same manner as in the case of FIG. 11(*b*).

In the above exemplary semiautomatic-mode print parameter setting process, a printing pressure and plate release conditions are set in the same manner as in the automatic-mode process, that is, on the basis of automatic inspection results of a solder charging state and a solder transfer state that are obtained by using the functions of the laser measuring instrument 20, the shape detecting unit 30, and the inspection processing unit 34. Alternatively, print parameters may be set by visual inspections without using these functions. More specifically, the operator detects a solder charging state and a solder transfer state by visually observing a solder charging state on the mask plate 12 obtained after a squeegeeing operation and a solder transfer state on the board 6 obtained after plate separation and sets print parameters on the basis of inspection results.

In this case, the print parameter setting processing unit 33 (print parameter setting processing means) shown in FIG. 8 performs processing of setting the print parameters to proper values on the basis of inspection results of a cream solder charging state in the pattern holes 12*a* and a cream solder transfer state on the board 6 that are obtained when the print parameters including the squeegee movement speed, the printing pressure, and the plate release speed are varied. In this print parameter setting process, a processing procedure is displayed so that a squeegee movement speed is set first and then a printing pressure and plate release conditions are set in order.

As described above, in the screen printing apparatus according to the embodiment, in the print parameter setting process for setting print parameters including a squeegee movement speed, a printing pressure, and plate release conditions, first a squeegee movement speed at which to move the squeegees is set at the first step. This makes it possible to set, first, a squeegeeing operation time that is the main part of a cycle time of screen printing. Then, a printing pressure for realizing a desired cream solder charging state is set at the second step and plate release conditions for realizing a desired cream solder transfer state are set at the third step.

Therefore, print parameters can be set according to an efficient procedure with only a low frequency of occurrence of trial-and-error-based backward work even in setting print parameters for a new solder type to which an existing print parameter library cannot be applied. In this print parameter setting processing work, the apparatus automatically performs the setting processing work according to this procedure or displays a processing procedure to an operator. Therefore, even an unskilled operator can always perform this work following a correct procedure.

As a result, even where it is necessary to use many kinds of solder such as lead-free solder that are low in multiplicity of use, ordinary, unskilled operators can perform print parameter setting work quickly and properly, which only skilled operators were able to do conventionally.

According to the invention, in the print parameter setting process for setting print parameters including a squeegee movement speed, a printing pressure, and plate release conditions, a squeegee movement speed at which the squeegee is to be moved is set at the first step, then a printing pressure for realizing a desired cream solder charging state is set at the second step, and then plate release conditions for realizing a desired cream solder transfer state is set at the third step. Therefore, the print parameter setting process can be performed according to an efficient processing procedure and trial-and-error-based backward work can be prevented. Print parameters can be set quickly and properly for a wide range of solder types.

What is claimed is:

1. A screen printing apparatus for printing on a board using cream solder through pattern holes of a mask plate by performing a squeegeeing operation in which the mask plate is laid on a board, comprising:

a squeegee moved slidingly on a top surface of the mask plate while applying a constant printing pressure to the mask plate;

a printing pressure applying means for applying printing pressure to the mask plate by pressing the squeegee against the mask plate;

a squeegee moving means for moving the squeegee in a horizontal direction;

a plate separation means for separating the board from a bottom surface of the mask plate;

a printing control means for performing a printing operation at a prescribed squeegee movement speed and a prescribed printing pressure under prescribed plate release conditions by controlling the printing pressure applying means, the squeegee moving means, and the plate separation means;

an inspecting means for inspecting a state of charging of the pattern holes with the cream solder and a state of transfer of the cream solder to the board by detecting states of the cream solder on the top surface of the mask plate and on a top surface of the board;

a print parameter setting processing means for setting print parameters including the squeegee movement speed, the printing pressure, and a plate release speed to proper values on the basis of inspection results of the inspecting means that are obtained when the print parameters are varied according to prescribed parameter varying patterns that are set for the respective print parameters; and a print parameter storing means for storing the thus-set print parameters.

2. The screen printing apparatus according to claim 1, wherein the print parameter setting means sets the squeegee movement speed, the printing pressure, and the plate release conditions in this order.

3. A screen printing apparatus for printing on a board using cream solder through pattern holes of a mask plate by performing a squeegeeing operation in which the mask plate is laid on a board, comprising:

a squeegee moved slidingly on a top surface of the mask plate while applying a constant printing pressure to the mask plate;

a printing pressure applying means for applying printing pressure to the mask plate by pressing the squeegee against the mask plate;

a squeegee moving means for moving the squeegee in a horizontal direction;

a plate separation means for separating the board from a bottom surface of the mask plate;

a printing control means for performing a printing operation at a prescribed squeegee movement speed and a prescribed printing pressure under prescribed plate release conditions by controlling the printing pressure applying means, the squeegee moving means, and the plate separation means;

a print parameter setting processing means for setting print parameters including the squeegee movement speed, the printing pressure, and a plate release speed to proper values on the basis of inspection results of a state of charging of the pattern holes with the cream solder and a state of transfer of the cream solder to the board that are obtained when the print parameters are varied;

a print parameter storing means for storing the thus-set print parameters; and a processing procedure display means for displaying a processing procedure in print parameter setting processing of the print parameter setting processing means.

4. The screen printing apparatus according to claim 3, wherein the processing procedure display means displays processing procedure so that the squeegee movement speed, the printing pressure, and the plate release conditions are set in this order.

5. A screen printing method for printing on a board using cream solder through pattern holes of a mask plate by performing a squeegeeing operation in which the mask plate is laid on a board and a squeegee is moved slidingly on the mask plate while the squeegee applies a constant printing pressure to the mask plate, characterized in:

that print parameter setting process for setting print parameters including a squeegee movement speed, a printing pressure, and plate release conditions that are specified when a printing operation is performed while a printing control means controls a printing pressure applying means for applying printing pressure to the mask plate by pressing the squeegee against the mask plate, a squeegee moving means for moving the squeegee in a horizontal direction, and a plate separation means for separating the board from a bottom surface of the mask plate includes a first step of setting a squeegee movement speed at which the squeegee is to be moved, a second step of setting a printing pressure at which the squeegee is to be pressed against the mask plate, and a third step of setting a plate release speed at which the board is to be separated from the bottom surface of the mask plate;

that in the second step a printing pressure for realizing a desired cream solder charging state is set by performing squeegeeing operations at the squeegee movement speed that was set at the first step while varying the printing pressure according to a prescribed varying pattern and inspecting a state of charging of the pattern holes with the cream solder at each printing pressure by detecting a state of the cream solder on the mask plate; and that in the third step plate release conditions for realizing a desired cream solder transfer state are set by performing a squeegeeing operation at the squeegee movement speed that was set at the first step and at the printing pressure that was set at the second step, and then performing plate separation operations of separating the board from the bottom surface of the mask plate while varying the plate release conditions according to prescribed varying patterns and inspecting a cream solder transfer state on the board under each set of plate release conditions.

6. The screen printing method according to claim 5, wherein a fourth step of setting a squeegee movement speed that is higher than the squeegee movement speed that was set at the first step and a fifth step of setting a printing pressure at the squeegee movement speed that was set at the fourth step are executed after the third step; and in the fifth step a printing pressure for realizing a desired cream solder charging state is set by performing squeegeeing operations while varying the printing pressure according to a prescribed varying pattern and inspecting a state of charging of the pattern holes with the cream solder at each printing pressure by detecting a state of the cream solder on the mask plate.

7. A printing condition setting method for a screen printing apparatus which prints cream solder on a board through pattern holes of a mask plate by performing a squeegeeing operation, a squeegee is moved slidingly on a top surface of the mask plate while the squeegee is applyied constant printing pressure to the mask plate; the setting method comprising:

a first step of setting a squeegee movement speed at which the squeegee is to be moved;

a second step of setting a printing pressure at which the squeegee is to be pressed against the mask plate; and a third step of setting a plate release speed at which the board is to be separated from the bottom surface of the mask plate, wherein the second step includes a step of performing squeegeeing operations at the squeegee movement speed that was set at the first step while varying the printing pressure according to a prescribed varying pattern, and a step of inspecting a state of charging of the pattern holes with the cream solder at each printing pressure by detecting a state of the cream solder on the mask plate, and the third step includes a step of performing a squeegeeing operation at the squeegee movement speed that was set at the first step and at the printing pressure that was set at the second step, a step of performing plate separation operations of separating the board from the bottom surface of the mask plate while varying the plate release conditions according to prescribed varying patterns, and a step of inspecting a cream solder transfer state on the board under each set of plate release conditions.

8. The printing condition setting method according to claim 7, wherein a fourth step of setting a squeegee movement speed that is higher than the squeegee movement speed that was set at the first step and a fifth step of setting a printing pressure at the squeegee movement speed that was set at the fourth step are executed after the third step; and in the fifth step a printing pressure for realizing a desired cream solder charging state is set by performing squeegeeing operations while varying the printing pressure according to a prescribed varying pattern and inspecting a state of charging of the pattern holes with the cream solder at each printing pressure by detecting a state of the cream solder on the mask plate.

* * * * *

UNITED STATES PATENT AND TRADEMARK OFFICE
CERTIFICATE OF CORRECTION

PATENT NO. : 6,945,167 B2  Page 1 of 1
DATED : September 20, 2005
INVENTOR(S) : Maeda et al.

It is certified that error appears in the above-identified patent and that said Letters Patent is hereby corrected as shown below:

Column 14,
Line 12, delete "applyied" and insert -- applied --.

Signed and Sealed this

Sixth Day of June, 2006

JON W. DUDAS
*Director of the United States Patent and Trademark Office*